United States Patent [19]

Suematsu et al.

[11] Patent Number: 5,043,673
[45] Date of Patent: Aug. 27, 1991

[54] COMPENSATING CIRCUIT FOR A HIGH FREQUENCY AMPLIFIER

[75] Inventors: Noriharu Suematsu; Tadashi Takagi; Shuji Urasaki, all of Kamakura; Katsuhisa Uno; Masahiro Kamiyama, both of Tokyo, all of Japan

[73] Assignee: Mitsubishi Denki Kabushiki Kaisha, Japan

[21] Appl. No.: 500,960

[22] Filed: Mar. 29, 1990

[30] Foreign Application Priority Data

Mar. 31, 1989 [JP] Japan .................................. 1-80907
Nov. 17, 1989 [JP] Japan .................................. 1-298823

[51] Int. Cl.$^5$ ............................................. H03F 1/26
[52] U.S. Cl. .................................... 330/149; 330/151
[58] Field of Search ............ 307/529; 330/107, 124 R, 330/149, 151, 286, 295; 328/162, 163

[56] References Cited

U.S. PATENT DOCUMENTS 4,629,996 12/1986 Watanabe et al. .................. 330/151

OTHER PUBLICATIONS

Czech, "A Linearized . . . Communication Satellites", AIAA-84-0766, pp. 511-519.
Ono et al., "Ku-Band Solid State Power Amplifier", AIAA-88-0834, pp. 727-741.

Primary Examiner—Steven Mottola
Attorney, Agent, or Firm—Leydig, Voit & Mayer

[57] ABSTRACT

A non-linearity compensating circuit for a high frequency amplifier includes a first divider for dividing a high frequency input signal into two signals, a distortion generating amplifier for non-linearly amplifying the first output of the first divider, a linear amplifier for linearly amplifying the second output from the first divider, a second divider for dividing the output of the linear amplifier into first and second signals, a first combiner for combining the output of the distortion generating amplifier with the first signal to extract the distortion component of the distortion generating amplifier, and a second combiner for combining the second signal with the distortion component.

10 Claims, 3 Drawing Sheets

COMPENSATING CIRCUIT FOR A HIGH FREQUENCY AMPLIFIER

FIELD OF THE INVENTION

The present invention relates to a compensating circuit for correcting signal distortion arising due to the high frequency amplifier operating at microwave and millimeter wave frequencies.

BACKGROUND OF THE INVENTION

FIG. 4 shows a compensating circuit of a prior art high frequency amplifier which is disclosed in Japanese Published Patent Application 52-5240. In the figure, reference numeral 1 designates an input terminal, reference numeral 2 designates an output terminal, and reference numeral 12 designates a divider for dividing the input signal into three signals. Reference numeral 20 designates a distortion generating amplifier, reference numerals 21 and 22 designate linear amplifiers, and reference numerals 25a to 25d designate variable attenuators, and reference numeral 30a designates a combiner for combining the output of the distortion generating amplifier 20 with the output of the linear amplifier 21 in reversed phase to extract the distortion component. Reference numeral 30b designates a combiner for combining the distortion component which is extracted by the distortion extracting combiner 30a with the output of the linear amplifier 22 in reversed phase. Reference numeral 40 designates a high frequency amplifier the non-linearity of which is to be compensated.

A description is given of the operation of the circuit.

The signal which is input to the input terminal 1 is divided into three by the 12. The first divider output of the divider 12 is introduced to the distortion generating amplifier 20. The signal amplified by the distortion generating amplifier 20 is output and includes a distortion component. The output signal from amplifier 20 is introduced to the distortion extracting combiner 30a through the variable attenuator 25a. The second output of the divider 12 is introduced to the linear amplifier 21 through the variable attenuator 25b and amplified without a distortion component and is introduced to the distortion extracting combiner 30a. In the distortion extracting combiner 30a, the output including the distortion component of the distortion generating amplifier 20 and the output of the linear amplifier 21 including no distortion component are combined with the phase of one of the signals reversed so that only the distortion component of the output of the distortion generating amplifier 20 is extracted. That distortion component is introduced to the combiner 30b. The third output of the divider 12 is amplified without a distortion component by the linear amplifier 22 through the variable attenuator 25d and is supplied to the combiner 30b. At the combiner 30b, the output of the distortion extracting combiner 30a which has passed through the variable attenuator 25c, and the output of the linear amplifier 22 are combined with the phase of one of the outputs reversed. The combined output is input to the amplifier 40, the non-linearity of which is to be compensated, and the signal is amplified cancelling the distortion component generated by the amplifier 40. Thus, an output including no distortion component is output to the output terminal 2. Here, the variable attenuator 25c is adjusted such that it cancels the distortion component generated by the amplifier 40 and the distortion component is not output to the output terminal 2.

The compensating circuit of the prior art high frequency amplifier is constituted as described above. In order to correct the signal delay due to the distortion generating amplifier 25 a linear amplifier must be included in each of the other two signal paths, requiring two linear amplifiers, resulting in a large size circuit.

Since the number of dividers and combiners through which a signal passes is different depending on the signal path, it is not possible to keep the phase relation between the respective paths constant over a wide frequency range, making it impossible to compensate for the non-linearity of the high frequency amplifier over a wide frequency range.

SUMMARY OF THE INVENTION

It is an object of the present invention to provide a compensating the circuit for a high frequency amplifier that is effective over a wide frequency band.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to a first aspect of the present invention, a compensating circuit for a high frequency amplifier divides an input into two signals, the first divider output is introduced to a distortion generating amplifier, the second divider output is introduced to a linear amplifier and thereafter divided into two signals, one of the two signals is combined with the output of the distortion generating amplifier to extract the distortion component of the distortion generating amplifier, and the distortion component and the second divider output of the two output divider, after amplification by the linear amplifier, are combined in reversed phase.

According to a second aspect of the present invention, a compensating circuit for a high frequency amplifier divides the input signal into two signals and the first divider output is introduced to a distortion generating amplifier. The second divider output is introduced to a linear amplifier which linearly amplifies the signal. The output of the distortion generating amplifier is divided into two signals the first of which is connected to a non-reflecting termination and the second of which is connected to an input of a first combiner. The output of the linear amplifier is divided into two signals, and the second output of the distortion generating amplifier and one output of the linear amplifier are combined to extract the distortion component of the distortion generating amplifier. Another output of the linear amplifier and the voltage level of the non-reflecting termination are combined, and this combined output is combined with the above-described distortion component in reversed phase. Thereby, the numbers of amplifiers and dividers or combiners on the respective paths are equal to each other.

In accordance with the first aspect of the present invention, because a divider is provided after the linear amplifier, the signal delay due to the distortion generating amplifier is corrected by one linear amplifier, and the size of the circuit is reduced.

In accordance with the second aspect of present invention, because the number of the amplifiers and the dividers or combiners on the respective signal paths are equal, the non-linearity of the high frequency amplifier is compensated over a wide frequency range.

DETAILED DESCRIPTION OF THE PREFERRED EMBODIMENTS

Figure 1:
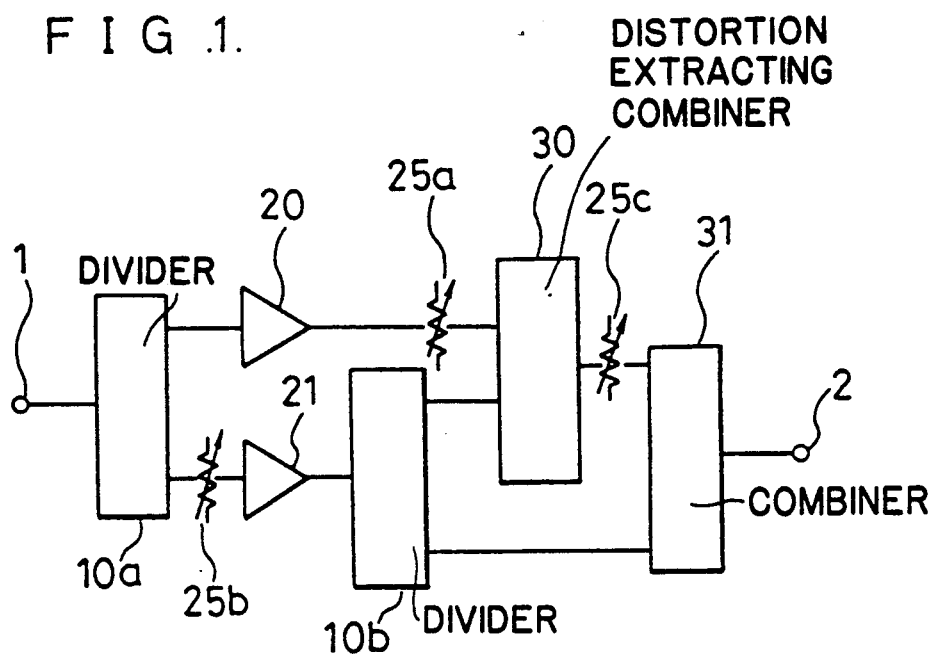
FIGS. 1, 2, and 3 are diagrams of a compensating circuit for a high frequency amplifier according to a first, a second, and a third embodiment according to the present invention; respectively

FIG. 1 shows a compensating circuit for a high frequency amplifier according to a first embodiment of the present invention.

Figure 4:
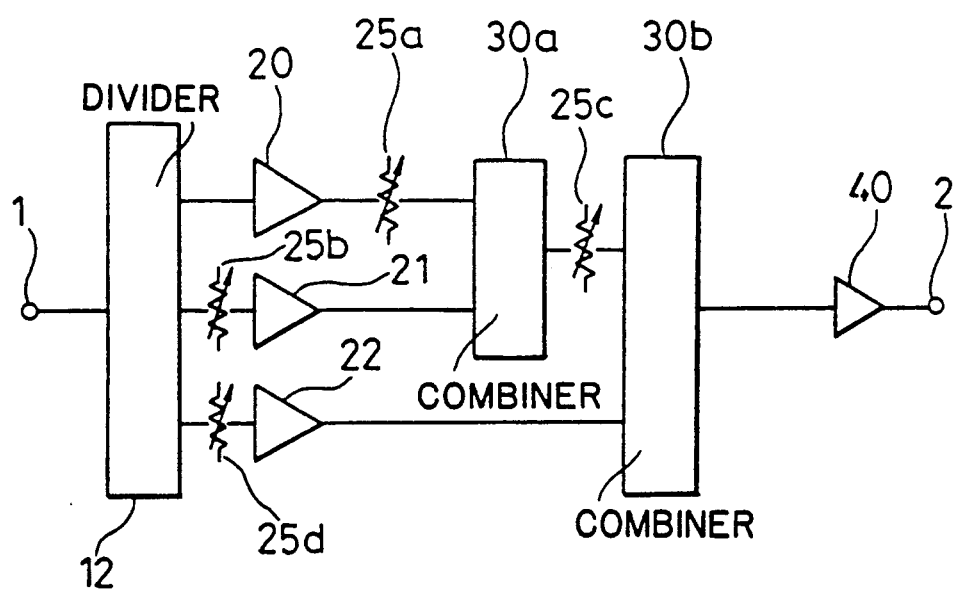
FIG. 4 is a diagram of a compensating circuit according to the prior art.

In FIG. 1, reference numeral 1 designates an input terminal, reference numeral 2 designates an output terminal, reference numeral 10a designates a divider for dividing the input signal into two signals, and reference numeral 20 designates a distortion generating amplifier for amplifying the first output of the divider 10a and including a distortion component. Reference numeral 21 designates a linear amplifier for amplifying the second output of the divider 10a without introducing a distortion component. Reference numeral 25b designates a variable attenuator for adjusting the input signal level so that the linear amplifier 21 operates in a linear region. Reference numeral 10b designates a divider for dividing the output of the linear amplifier 21 into two signals. Reference numeral 30 designates a combiner for combining the output of the distortion generating amplifier 20 with the first output of the divider 10b, which includes no distortion component, with the phase of one of the signals reversed to extract only the distortion component. Reference numeral 25a designates a variable attenuator for making the levels of the two signals which are input to the distortion extracting combiner 30 equal. Reference numeral 31 designates a combiner for combining the distortion component output of the distortion extracting combiner 30 with the second output of the divider 10b including no distortion component with the phase of one of the signals reversed. Reference numeral 25c designates a variable attenuator for controlling the ratio of the distortion component when combining the signal component with the distortion component in the combiner 31. The circuit of this figure does not include the amplifier 40 which is to be compensated as shown in FIG. 4.

A description is given of the operation of the circuit.

The signal input to the input terminal 1 is divided into two signals by the divider 10a. The first divider output is amplified by the distortion generating amplifier 20 and, therefore includes a distortion component. The second output of the divider 10a is attenuated by the variable attenuator 25b so that the linear amplifier 21 operates in a linear region and is amplified by the linear amplifier 21 without introducing a distortion component. The signal amplified by the linear amplifier 21 divided into two signals by the divider 10b. The output of the distortion generating amplifier 20 is attenuated by the variable attenuator 25a so that the power level of the output signal component and the signal component of a first output of the divider 10b are equal to each other. The attenuated signal is introduced to the distortion extracting combiner 30 together with the first output of the divider 10b so that they are combined with the phase signal reversed, and only the distortion component is output. The second output of the divider 10b including no distortion component and the output including only the distortion component of the distortion extracting combiner 30 which has passed through the variable attenuator 25c are combined by the combiner 31 with the phase one, one of the signals revised and the combination is output to the output terminal 2. The variable attenuator 25c is used to adjust the power level of the distortion component signal relative to the signal at the output terminal 2.

Figure 2:
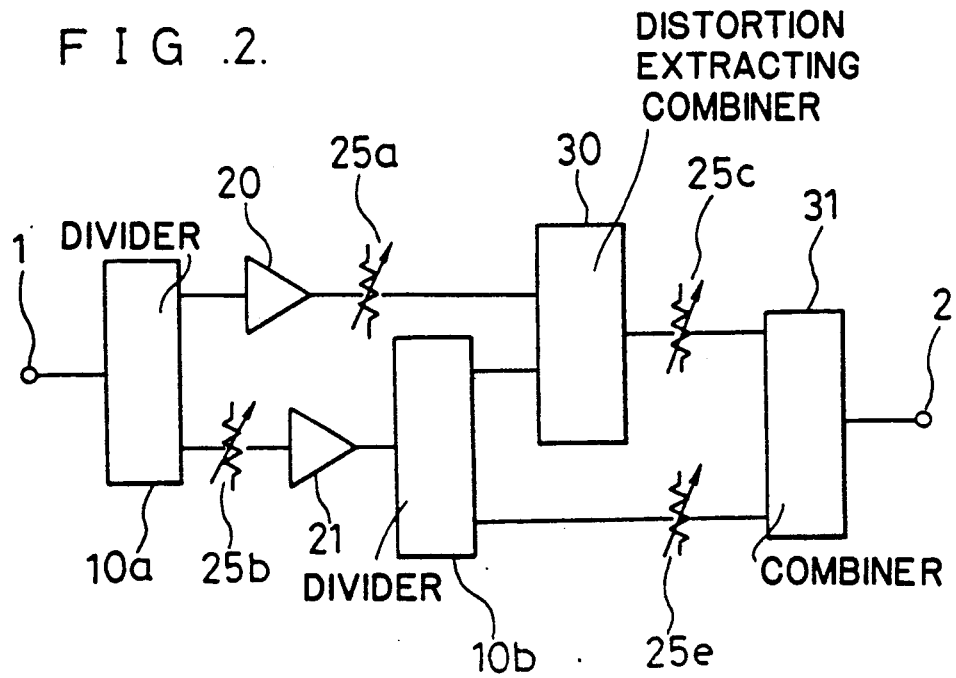

In the above-illustrated embodiment, correction of the signal delay due to the variable attenuator 25c is not considered. Correction of the signal delay due to the variable attenuator is effective when a semiconductor element, such as a dual gate FET, is used as a variable attenuator. A second embodiment having such a construction is shown in FIG. 2.

In, although the signal delay due to the variable attenuator 25a is corrected by the variable attenuator 25b, the signal delay due to the variable attenuator 25c is not corrected in FIG. 1. By inserting a variable attenuator 25e between the second output of the divider 10b and the combiner 31 as shown in FIG. 2, the signal delay due to the variable attenuator 25c is corrected.

Figure 3:
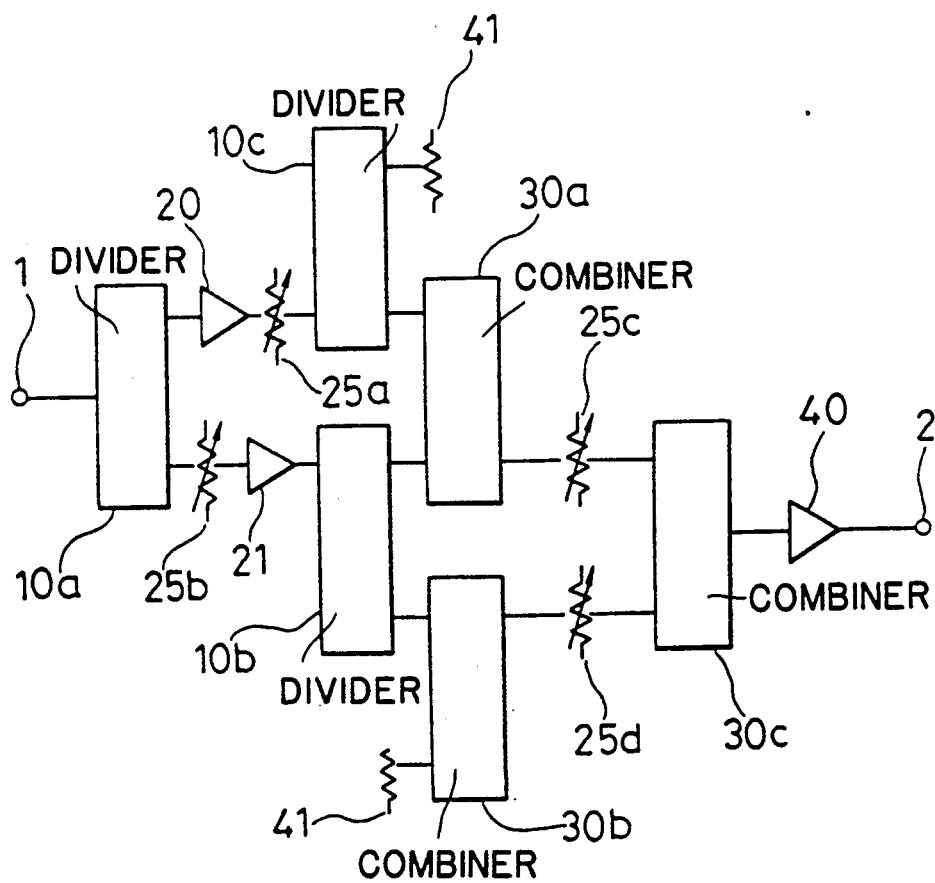

FIG. 3 shows a third embodiment of the present invention in which the number of circuits on the respective paths are equal to each other, enabling compensation of non-linearity of the amplifier over a wide frequency range. In FIG. 3, reference numeral 1 designates an input terminal, and reference numeral 2 designates an output terminal, reference numeral 10a designates a divider for dividing the input signal into two signals. Reference numeral 20 designates a distortion generating amplifier for amplifying the first output of the divider 10a and including a distortion component. Reference numeral 21 designates a linear amplifier for amplifying the second output of the divider 10a including no distortion component. Reference numeral 25b designates a variable attenuator for adjusting the input level so that the linear amplifier 21 operates in a linear region. Reference numeral 10b designates a divider for dividing the output of the linear amplifier 21 into two signals. Reference numeral 10c designates a divider providing circuit symmetry for the divider 10b. Herein, one divider output of the divider 10c is connected to a non-reflecting termination 31. Reference numeral 30a designates a combiner for combining the output including the distortion component of the distortion generating amplifier 20 with the first divider output of the divider 10b including no distortion component, with one of the signals in reversed phase to produce only the distortion component. Reference numeral 25a designates a variable attenuator for making the power levels of the two signals which are input to the distortion extracting combiner 30a equal. Reference numeral 30b designates a combiner providing circuit symmetry for the distortion extracting combiner 30a. A non-reflecting termination 31 is connected to one input of the combiner 30b. Reference numeral 30c designates a combiner for combining the output including only the distortion component which is extracted by the distortion extracting combiner 30a with the combiner output of the combiner 30b including no distortion component in reversed phase. Reference numerals 25c and 25d designate variable attenuators for controlling the ratio of the distortion component while combining the output including only the distortion component with the output including no distortion component in the combiner 30c. Reference numeral 40 designates a high frequency amplifier, the non-linearity of which is to be compensated.

A description is given of the operation of the circuit.

The signal input to the input terminal 1 is divided into two signals by the divider 10a and the first divider output is amplified by the distortion generating amplifier 20. The second divider output of the divider 10a is attenuated by the variable attenuator 25b to a power level so that the linear amplifier 21 operates in a linear region and amplified by the linear amplifier 21 without introducing a distortion component. The signal obtained is divided into two signals by the divider 10b.

The output of the distortion generating amplifier 20 is attenuated by the variable attenuator 25a so that the power level of the signal component after passing through the divider 10c and the power level of the signal component of the first output of the divider 10b are equal to each other. After passing through the divider 10c, the signal containing the distortion component is introduced to the distortion extracting combiner 30a together with the first output of the divider 10b. The two signals are combined with the phase of one reversed in the combiner 30a and only the distortion component is output. The second divider output of the 10b including no distortion component passes through the combiner 30b and the variable attenuator 25d and is combined with the output including only the distortion component with the phase of one of the signals reversed in the combiner 30c. The output of the combiner 30c is amplified by the high frequency amplifier 40, compensating the non-linearity of that amplifier and is output to the output terminal 2. The variable attenuators 25c and 25d are used to adjust the power levels of the signals supplied to the combiner 30c and thereby of the signal component and the distortion component in the output of the combiner 30c. In this circuit, all the signal paths include one amplifier, one divider, and two combiners. Therefore it is possible to maintain the phase relationship between the respective paths constant over a wide frequency range. Thus, the non-linearity of the high frequency amplifier 40 is compensated over a wide frequency range.

In the above-illustrated embodiments variable attenuators are shown. Those attenuators may be replaced by variable gain transistors and amplifiers such as a dual gate FET.

The above-illustrated embodiments concern an RF section but may also be used in an IF section.

As is evident from the foregoing description, according to the present invention, an input signal is divided into two signals, the first divider output is introduced to a distortion generating amplifier, the second divider output is introduced to a linear amplifier and thereafter divided into first and second, and signals, the output of the distortion generating amplifier and the first signal are combined with the phase of one reversed, whereby the distortion component of the distortion generating amplifier is extracted. The distortion component and the are combined with the phase of one reversed. Thus, only one linear amplifier is needed and the circuit construction is reduced in size.

According to the present invention, in a non-linearity compensating circuit for a high frequency amplifier an input signal is divided into two signals and the first output is introduced to a distortion generating amplifier, the second output is introduced to a linear amplifier which linearly amplifies the signal. The output of the distortion generating amplifier is divided into first and second signals, the first of which is connected to a non-reflecting termination and the second of which is connected to an input of a first combiner. The output of the linear amplifier is divided into third and fourth signals, and the second signal and the third amplifier are combined to extract the distortion component of the output of the distortion generating amplifier. The fourth signal and the distortion component are combined with the phase of one of the signals reversed. Thereby, the numbers of amplifiers dividers, and or combiners on the respective paths are equal to each other. Thus, the non-linearity of the high frequency amplifier is compensated over a wide frequency range.

What is claimed is:

1. A circuit for compensating non-linearities of a high frequency amplifier comprising:
    a first signal divider for dividing a high frequency input signal into first and second signals;
    a distortion generating amplifier for non-linearly amplifying the first signal to produce a third signal including a distortion component;
    a linear amplifier for linearly amplifying the second signal to produce a fourth signal;
    a second signal divider for dividing the fourth signal into fifth and sixth signals;
    a first signal combiner for combining the third and fifth signals to extract the distortion component; and
    a second signal combiner for combining the sixth signal with the extracted distortion component.

2. A circuit as defined in claim 1 including a first variable attenuator connected between said first combiner and said second combiner for attenuating the extracted distortion component.

3. A circuit for compensating non-linearities of a high frequency amplifier comprising:
    a first signal divider for dividing a high frequency input signal into first and second signals;
    a distortion generating amplifier for non-linearly amplifying the first signal to produce a third signal including a distortion component;
    a linear amplifier for linearly amplifying the second signal to produce a fourth signal;
    a second signal divider for dividing the third signal into fifth and sixth signals and a first non-reflecting termination connected to receive the fifth signal;
    a third signal divider for dividing the fourth signal into seventh and eighth signals;
    a first signal combiner for combining the sixth and seventh signals to extract the distortion component;
    a second non-reflecting termination and a second signal combiner for producing a ninth signal, said second signal combiner having first and second input terminals, wherein said first input terminal is connected to receive the eighth signal and the second input terminal is connected to said second non-reflecting termination; and
    a third signal combiner for combining the extracted distortion component and the ninth signal.

4. A circuit as defined in claim 1 including a variable attenuator connected between said distortion generating amplifier and said first signal combiner for attenuating the third signal.

5. A circuit as defined in claim 1 including a variable attenuator connected between said first signal divider and said linear amplifier for attenuating the second signal to ensure linear amplification by said linear amplifier.

6. A circuit as defined in claim 1 including a variable attenuator connected between said second signal divider and said second signal combiner for attenuating the sixth signal.

7. A circuit as defined in claim 3 including a variable attenuator connected between said distortion generating amplifier and said second signal combiner for attenuating the third signal.

8. A circuit as defined in claim 3 including a variable attenuator connected between said first signal divider and said linear amplifier for attenuating the second signal to ensure linear amplification by said linear amplifier.

9. A circuit as defined in claim 3 including a variable attenuator connected between said first signal combiner and said third signal combiner for attenuation of the extracted distortion component.

10. A circuit as defined in claim 3 including a variable attenuator connected between said second signal combiner and said third signal combiner for attenuation of the ninth signal.

* * * * *

UNITED STATES PATENT AND TRADEMARK OFFICE
CERTIFICATE OF CORRECTION

PATENT NO. : 5,043,673

DATED : August 27, 1991

INVENTOR(S) : Suematsu et al

It is certified that error appears in the above-identified patent and that said Letters Patent is hereby corrected as shown below:

On the title page:
Item No. [73], Assignee, should read --Mitsubishi Denki Kabushiki Kaisha and Nippon Telegraph And Telephone Corporation--.

Signed and Sealed this

Tenth Day of May, 1994

Attest:

BRUCE LEHMAN

Attesting Officer

Commissioner of Patents and Trademarks